(12) United States Patent
Jung

(10) Patent No.: US 7,959,818 B2
(45) Date of Patent: *Jun. 14, 2011

(54) METHOD FOR FORMING A FINE PATTERN OF A SEMICONDUCTOR DEVICE

(75) Inventor: Jae Chang Jung, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 766 days.

This patent is subject to a terminal disclaimer.

(21) Appl. No.: 11/772,016

(22) Filed: Jun. 29, 2007

(65) Prior Publication Data

US 2008/0064213 A1    Mar. 13, 2008

(30) Foreign Application Priority Data

Sep. 12, 2006 (KR) .................. 10-2006-0087853
Jun. 28, 2007 (KR) .................. 10-2007-0064135

(51) Int. Cl.
*B44C 1/22* (2006.01)
*C03C 15/00* (2006.01)
*C03C 25/68* (2006.01)
*C23F 1/00* (2006.01)

(52) U.S. Cl. .............. 216/46; 216/41; 438/696

(58) Field of Classification Search .......... 216/41, 216/46; 438/696; 430/312, 313
See application file for complete search history.

(56) References Cited

U.S. PATENT DOCUMENTS

| 5,328,810 | A | 7/1994 | Lowrey et al. |
| 5,858,620 | A | 1/1999 | Ishibashi et al. |
| 6,051,678 | A | 4/2000 | Kim et al. |
| 6,132,926 | A | 10/2000 | Jung et al. |
| 6,143,463 | A | 11/2000 | Jung et al. |
| 6,150,069 | A | 11/2000 | Jung et al. |
| 6,180,316 | B1 | 1/2001 | Kajita et al. |
| 6,225,020 | B1 | 5/2001 | Jung et al. |
| 6,235,447 | B1 | 5/2001 | Lee et al. |
| 6,235,448 | B1 | 5/2001 | Lee et al. |
| 2004/0102048 | A1 | 5/2004 | Yamaguchi |
| 2007/0059644 | A1 | 3/2007 | Takahashi et al. |
| 2008/0063986 | A1 * | 3/2008 | Jung ....................... 430/312 |

FOREIGN PATENT DOCUMENTS

| EP | 1 422 566 A1 | 5/2004 |
| JP | 2004014652 | 1/2004 |
| TW | 569305 (B) | 1/2004 |
| TW | 230976 (B) | 4/2005 |
| TW | 200527165 | 8/2005 |
| TW | 253681 (B) | 4/2006 |

* cited by examiner

*Primary Examiner* — Roberts Culbert
(74) *Attorney, Agent, or Firm* — Kilpatrick Townsend & Stockton LLP

(57) ABSTRACT

A method for forming a fine pattern of a semiconductor device includes forming a photoresist pattern over a semiconductor substrate including an underlying layer. A cross-linking layer is formed on the sidewall of the photoresist pattern. The photoresist pattern is then removed to form a fine pattern comprising the cross-linking layer. The underlying layer is etched using the fine pattern as an etching mask. As a result, the underlying layer has a smaller size than a minimum pitch.

20 Claims, 3 Drawing Sheets

METHOD FOR FORMING A FINE PATTERN OF A SEMICONDUCTOR DEVICE

CROSS-REFERENCES TO RELATED APPLICATIONS

The present application claims priority to Korean patent application number 10-2006-0087853 and 10-2007-0064135, respectively filed on Sep. 12, 2006 and Jun. 28, 2007, which are incorporated by references in their entireties.

BACKGROUND OF THE INVENTION

The present invention generally relates to a method for forming a fine pattern of a semiconductor device which has a pitch beyond a lithography limit.

Due to the popularization of information media such as computers, semiconductor device technology has advanced rapidly. Semiconductor devices are required to operate at a high speed and to have a high storage capacity. As a result, manufacturing technology of semiconductor device is required to manufacture a memory device of high capacity with improved integration, reliability and characteristics for accessing data.

In order to improve integration of the device, photolithography technology has developed to form finer patterns. The photolithography technology includes an exposure technology using chemically amplified Deep Ultra Violet (DUV) light sources such as ArF (193 nm) and VUV (157 nm), and a technology for developing photoresist materials suitable for the exposure light sources.

The processing speed of semiconductor devices depends on the line-width of patterns. For example, as the pattern line-width is decreased, the processing speed is increased to improve device performance. Therefore, it is important to control a critical dimension of the pattern line-width depending on the size of the semiconductor device.

A conventional method for forming a fine pattern of a semiconductor device is described as follows.

An underlying layer is formed over a semiconductor substrate, and a photoresist pattern is formed over the underlying layer by a lithography process. The photoresist pattern is obtained by coating photoresist over the underlying layer, and performing an exposure and developing process on the resulting structure. The underlying layer is etched using the photoresist pattern as an etching mask, and the photoresist pattern is removed to form an underlying pattern.

However, it is difficult to reduce the line-width of patterns due to a resolution limitation of lithography equipment.

SUMMARY OF THE INVENTION

Various embodiments of the present invention are directed at providing a method for forming a fine pattern of a semiconductor device which has a pitch beyond a lithography limit.

According to an embodiment of the present invention, a method for forming a fine pattern of a semiconductor device includes forming a photoresist pattern over a semiconductor substrate including an underlying layer. A silicon-including polymer layer is formed over the photoresist pattern and the semiconductor substrate including the underlying layer. A resulting structure comprising the silicon-including polymer layer, the photoresist pattern and the semiconductor substrate including the underlying layer is exposed and baked to form a cross-linking layer at an interface between the photoresist pattern and the silicon-including polymer layer. The exposed and baked resulting structure is developed to form the cross-linking layer on the sidewall of the photoresist pattern with a substantially constant thickness. The cross-linking layer is etched until a top portion of the photoresist pattern is exposed. The photoresist pattern is then removed to form a fine pattern comprising the cross-linking layer. The underlying layer is patterned using the fine pattern as an etching mask to form an underlying layer pattern.

In one embodiment, a method for forming a fine pattern of a semiconductor device includes forming a hard mask film over a semiconductor substrate including an underlying layer. A first photoresist pattern is formed over the hard mask film. A first silicon-including polymer layer is formed over the first photoresist pattern and the hard mask film. A resulting structure comprising the first silicon-including polymer layer, the photoresist pattern and the hard mask film is exposed and baked to form a cross-linking layer at an interface between the first photoresist pattern and the first silicon-including polymer layer. The exposed and baked resulting structure is developed to form the first cross-linking layer on the sidewall of the first photoresist pattern with a substantially constant thickness. The first cross-linking layer is etched until a top portion of the first photoresist pattern is exposed. The first photoresist pattern is then removed to form a fine pattern comprising the first cross-linking layer. The hard mask film is patterned using the fine pattern as an etching mask to form a hard mask film pattern.

A second photoresist pattern is formed between the hard mask film patterns. A second silicon-including polymer layer is formed on the second photoresist pattern, the hard mask film pattern and the underlying layer. A resulting structure comprising the second silicon-including polymer layer and the second photoresist pattern and the hard mask pattern is exposed and baked to form a second cross-linking layer at an interface between the second photoresist pattern and the second silicon-including polymer layer. The exposed and baked resulting structure is developed to form the second cross-linking layer on the sidewall of the second photoresist pattern with a substantially constant thickness. The second cross-linking layer is etched until a top portion of the second photoresist pattern is exposed. The second photoresist pattern is then removed to form a second fine pattern comprising the second cross-linking layer. The underlying layer is patterned using the second fine pattern and the hard mask film pattern as an etching mask. The hard mask film includes an amorphous carbon layer.

The first and second silicon-including polymer contain an epoxy group as a cross-linkable functional group. Specifically, an acid generated from the photoresist pattern by the exposure process penetrates into the silicon-including polymer layer and breaks the bonding of the epoxy group. An end portion of the separated epoxy group in the silicon-including polymer is cross-linked with the hydroxyl group of the photoresist material in the baking process. The silicon-including polymer which is not involved in the cross-linking layer formation is removed in a subsequent developing process, but the cross-linking layer which cross-links with the photoresist pattern is formed on the photoresist pattern.

DETAILED DESCRIPTION OF THE SPECIFIC EMBODIMENT

The present invention will be described in detail with reference to the accompanying drawings.

FIGS. 1a through 1f are cross-sectional diagrams illustrating a method for forming a fine pattern of a semiconductor device according to an embodiment of the present invention.

Figure 1A:
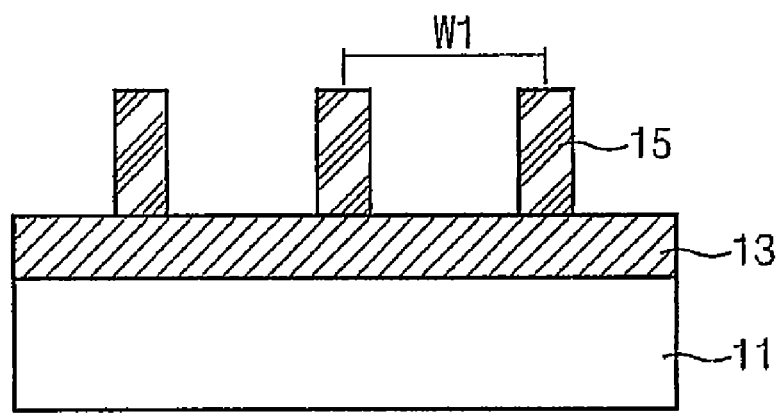
FIGS. 1a through 1f are cross-sectional diagrams illustrating a method for forming a fine pattern of a semiconductor device according to an embodiment of the present invention.

FIG. 1a shows an underlying layer 13 formed over a semiconductor substrate 11. The underlying layer 13 may be a word line, a bit line, a metal line and combination thereof.

A photoresist film (not shown) is coated over the underlying layer 13. An exposure and developing process is performed on the photoresist film with an exposure mask to form a photoresist pattern 15 having a line-width W1.

The photoresist film includes a chemically amplified photoresist polymer, a photoacid generator and an organic solvent. Example photoresist polymers that can be used include those disclosed in U.S. Pat. No. 6,051,678 (Apr. 18, 2000), U.S. Pat. No. 6,132,926 (Oct. 17, 2000), U.S. Pat. No. 6,143, 463 (Nov. 7, 2000), U.S. Pat. No. 6,150,069 (Nov. 21, 2000), U.S. Pat. No. 6,180,316 B1 (Jan. 30, 2001), U.S. Pat. No. 6,225,020 B1 (May 1, 2001), U.S. Pat. No. 6,235,448 B1 (May 22, 2001) and U.S. Pat. No. 6,235,447 B1 (May 22, 2001). Specifically, the polymer may be any of the following compounds: poly(1-cyclohexene-1-t-butylcarboxylate/maleic anhydride/2-cyclohexene-1-ol); poly(1-cyclohexene-1-t-butylcarboxylate/maleic anhydride/3-cyclohexene-1-methanol); poly(1-cyclohexene-1-t-butylcarboxylate/maleic anhydride/3-cyclohexene-1,1-dimethanol); poly(3-cyclohexene-1-t-butylcarboxylate/maleic anhydride/2-cyclohexene-1-ol); poly(3-cyclohexene-1-t-butylcarboxylate/maleic anhydride/3-cyclohexene-1-methanol); poly(3-cyclohexene-1-ethoxypropyl carboxylate/maleic anhydride/3-cyclohexene-1-methanol); poly(3-cyclohexene-1-t-butylcarboxylate/ maleic anhydride/3-cyclohexene-1,1-dimethanol); poly(3-(5-bicyclo[2.2.1]-heptene-2-yl)-1,1,1-(trifluoromethyl) propane-2-ol/maleic anhydride/2-methyl-2-adamantyl methacrylate/2-hydroxyethyl methacrylate); poly(3-(5-bicyclo[2.2.1]-heptene-2-yl)-1,1,1-(trifluoromethyl)propane-2-ol/maleic anhydride/2-methyl-2-adamantyl methacrylate/2-hydroxyethyl methacrylate/norbornylene); poly(3-(5-bicyclo[2.2.1]-heptene-2-yl)-1,1,1-(trifluoromethyl) propane-2-ol/maleic anhydride/t-butylmethacrylate/2-hydroxyethyl methacrylate); poly(t-butyl bicyclo[2.2.1]hept-5-en-2-carboxylate/2-hydroxyethyl bicyclo[2.2.1]hept-5-en-2-carboxylate/bicyclo[2.2.1]hept-5-en-2-carboxylic acid/ maleic anhydride/2-hydroxyethyl bicyclo[2.2.1]hept-5-en-2-carboxylate); and poly(t-butyl bicyclo[2.2.1]hept-5-en-2-carboxylate/2-hydroxyethyl bicyclo[2.2.1]hept-5-en-2-carboxylate/bicyclo[2.2.1]hept-5-en-carboxylic acid/maleic anhydride/2-hydroxyethyl bicyclo[2.2.2]oct-5-en-2-carboxylate). Each of the above chemical compounds contain monomers each having a hydroxyl group in order to improve substrate adhesiveness and cross-linking effects.

Any photoacid generators can be used to generate an acid by light exposure. The photoacid generator may be any of the following compounds: phthalimidotrifluoro methanesulfonate, dinitrobenzyltosylate, n-decyldisulfone, naphtylimidotrifluoro methanesulfonate, diphenyliodide hexafluorophosphate, diphenyliodide hexafluoroarsenate, diphenyliodide hexafluoroantimonate, diphenyl p-methoxyphenylsulfonium triflate, diphenyl p-toluenylsulfonium triflate, diphenyl p-isobutylphenylsulfonium triflate, triphenyl hexafluoroarsenate, triphenyl hexafluoroantimonate, triphenylsulfonium triflate or dibutyl naphtylsulfonium triflate.

The photoacid generator is present in an amount ranging from 0.1 to 10 parts by weight, based on 100 parts by weight of the photoresist polymer. When the photoacid generator is present in the amount of less than 0.1 parts by weight, the sensitivity of the photoresist to light becomes weak. When the photoacid generator is present in the amount of more than 10 parts by weight, the photoacid generator absorbs a large amount of distant ultraviolet rays and generates many acids to obtain a pattern having an unfavorable cross-section.

The organic solvent may include any of the following compounds: diethylene glycol diethyl ether, methyl 3-methoxypropionate, ethyl 3-ethoxypropionate, propyleneglycol methylether acetate, cyclohexanone, 2-heptanone, and mixtures thereof.

The organic solvent is present in an amount ranging from 100 to 2000 parts by weight, based on 100 parts by weight of the photoresist polymer in order to obtain a photoresist film having a desired thickness.

Figure 1B:
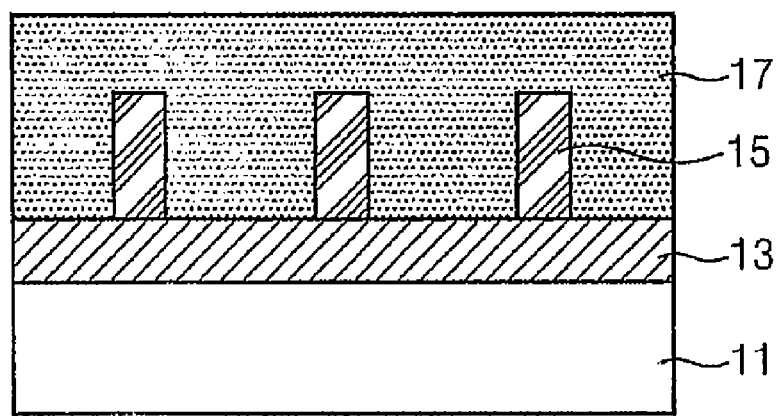

FIG. 1b shows a silicon-including polymer layer 17 formed over the resulting structure including the photoresist pattern 15.

The silicon-including polymer contains a silicon molecule which is present in an amount ranging from 10 to 40 wt %, based on the total weight of the polymer and an epoxy group as a cross-linkable functional group. When the silicon molecule is present in the amount of less than 10 wt %, a plurality of pores is generated in a residual cross-linking layer 19 after a blanket-etching process for exposing a top portion of the photoresist pattern 15 is performed. When the silicon molecule is present in the amount of more than 40 wt %, it is difficult to coat the silicon-including polymer layer 17 uniformly over the photoresist pattern.

The silicon-including polymer layer can be obtained by providing a polymer composition comprising a silicon-including polymer and solvent such as a $C_7 \sim C_{10}$ alkane solvent or a $C_5 \sim C_{10}$ alcohol, spin-coating the polymer composition and baking. Specifically, the silicon-including polymer includes polysiloxane compound, polysilsesquioxane compound or a mixture thereof.

For example, the $C_7 \sim C_{10}$ alkane solvent is selected from the group consisting of heptane, octane, nonane, decane and mixtures thereof. The $C_5 \sim C_{10}$ alcohol is selected from the group consisting of pentanol, heptanol, octanol, nonanol, decanol and mixtures thereof.

The resulting structure including the photoresist pattern 15 and the silicon-including polymer layer 17 is exposed and baked so that the cross-linking layer 19 is formed at an interface between the photoresist pattern 15 and the silicon-including polymer layer 17.

The exposure process is performed with an exposure energy ranging from 10 to 100 mj/cm$^2$, and preferably from 40 to 60 mj/cm$^2$.

The acid generated from the photoresist pattern 15 by the exposure process cleaves the bonding of the epoxy group in the silicon-including polymer layer 17. An end portion of the cleavage epoxy group is cross-linked with the hydroxyl group contained in the photoresist polymer in the baking process.

The thickness of the cross-linking layer 19 can be regulated depending on the baking conditions. For example, when the baking process is performed at a temperature ranging from 130 to 200° C., the cross-linking layer 19 (which has the same width and thickness as the photoresist pattern) is formed at an interface between the photoresist pattern 15 and the silicon-including polymer layer 17.

Figure 1C:
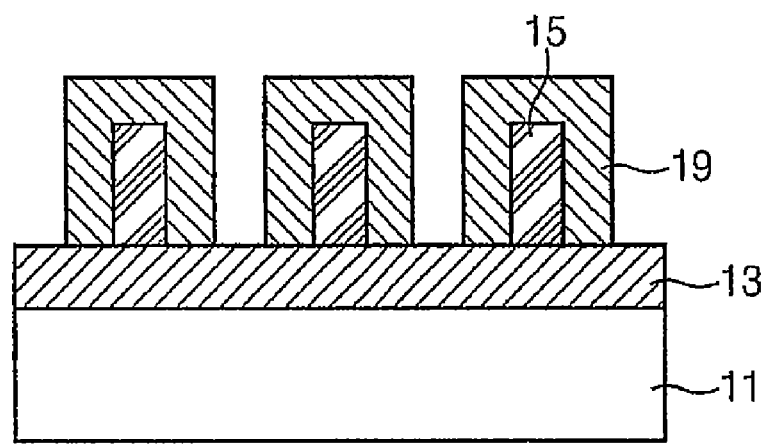

The resulting structure including the photoresist pattern 15, the silicon-including polymer layer 17, and the cross-linking layer 19 is developed to remove the silicon-including polymer layer 17 which is not cross-linked with the photoresist pattern 15. As a result, the cross-linking layer 19 is formed on the sidewall of the photoresist pattern 15 as shown in FIG. 1c.

In the developing process, the wafer is dipped in an n-pentanol for 50 to 70 seconds.

Figure 1D:
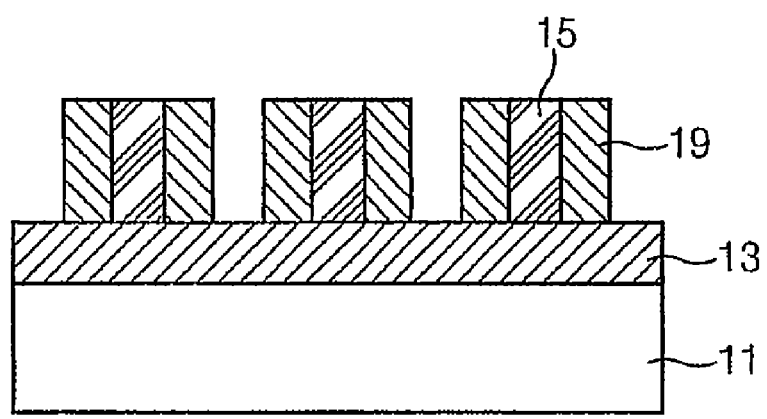

FIG. 1d shows the resulting structure obtained by performing a blanket-etching process to remove the cross-linking layer 19 until an upper portion of the photoresist pattern 15 is exposed.

The blanket-etching process is performed using a plasma etching gas comprising fluorine. Example plasma etching gases include $CF_4$, $CHF_3$, $C_2F_6$, $C_3F_8$, $C_4F_8$, and combinations thereof.

Figure 1E:
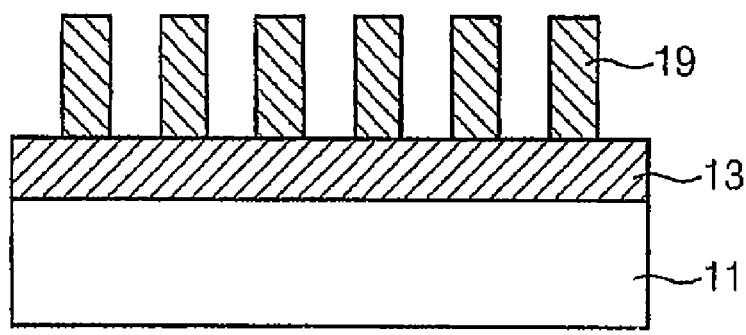

FIG. 1e shows a resulting structure obtained by removing the photoresist pattern 15 to remain the cross-linking layer 19. As a result, a fine pattern of the cross-linking layer 19 is formed.

The photoresist pattern 15 is removed using a mixture gas atmosphere employing $O_2$ and $N_2$ plasma gas. Specifically, the photoresist pattern 15 is removed using an etching gas including oxygen and nitrogen with a flow ratio of $O_2:N_2=1\text{-}15\%:85\text{-}99\%$, and preferably $O_2:N_2=10\%:90\%$.

After the photoresist pattern 15 is removed, a wafer including the resulting structure may be dipped in an n-pentanol for 50 to 70 seconds to wash the wafer.

Figure 1F:
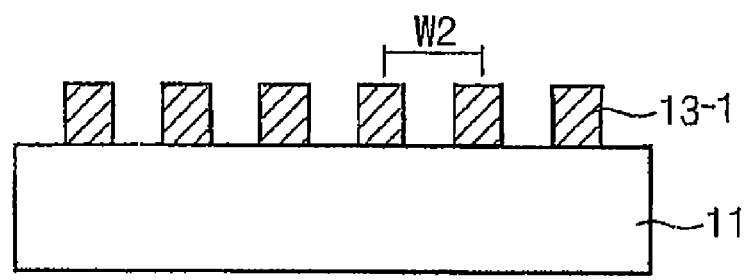

FIG. 1f shows a underlying layer pattern 13-1 obtained by patterning the underlying layer 13 using the fine pattern comprising the cross-linking layer 19 as an etching mask. The underlying layer pattern 13-1 has a line-width W2, where W1>W2.

In an embodiment of the present invention, a method for forming a fine pattern of a semiconductor device may perform the processes of FIGS. 1a through 1f at least twice.

Specifically, an amorphous carbon layer as a hard mask film (not shown) is formed over a semiconductor substrate including an underlying layer. A first photoresist pattern is formed on the hard mask film. The amorphous carbon layer has an etching selectivity that is similar to that of the cross-linking layer.

A first silicon-including polymer layer is formed over the first photoresist pattern and the amorphous carbon layer. A resulting structure comprising the first silicon-including polymer layer and the first photoresist pattern is exposed and baked to form a cross-linking layer at an interface between the first photoresist pattern and the first silicon-including polymer layer. The exposed and baked resulting structure is developed to form the first cross-linking layer on the sidewall of the first photoresist pattern with a substantially constant thickness.

The first cross-linking layer is etched until a top portion of the first photoresist pattern is exposed. The first photoresist pattern is then removed to form a fine pattern comprising the first cross-linking layer.

The amorphous carbon layer (not shown) is patterned using the first fine pattern as an etching mask to form an amorphous carbon layer pattern (not shown).

A second photoresist pattern (not shown) is formed between the amorphous carbon layer patterns. A second silicon-including polymer layer is formed over the second photoresist pattern and the hard mask film pattern. A resulting structure comprising the second silicon-including polymer layer, the second photoresist pattern and the amorphous carbon layer pattern is exposed and baked to form a second cross-linking layer (not shown) at an interface between the second photoresist pattern and the second silicon-including polymer layer. The exposed and baked resulting structure is developed to form the second cross-linking layer (not shown) on the sidewall of the second photoresist pattern with a substantially constant thickness.

The second cross-linking layer is etched until a top portion of the second photoresist pattern is exposed. The second photoresist pattern is then removed to form a second fine pattern comprising the second cross-linking layer. The underlying layer is patterned using the second fine pattern and the amorphous carbon layer pattern as an etching mask.

As a result, two or more fine patterns can be formed with a limited pitch obtained by a current exposer.

As described above, in a method for forming a fine pattern of a semiconductor device according to an embodiment of the present invention, a photoresist pattern is formed over a semiconductor substrate including an underlying layer. A silicon-including polymer layer containing a cross-linkable functional group is formed over a resulting surface of the photoresist pattern and the semiconductor substrate including the underlying layer. When the photoresist pattern and the silicon-including polymer layer are exposed, an acid generated from the photoresist pattern is penetrated into the silicon-including polymer layer to cleave an epoxy group in the silicon-including polymer. When an end portion of the epoxy group is cross-linked with an internal material of the photoresist pattern in a subsequent baking process, the silicon-including polymer which is not cross-linked with the photoresist pattern is removed so that the cross-linking layer remains on the photoresist pattern. The cross-linking layer is blanket-etched to expose the photoresist pattern. The photoresist pattern is removed to form a cross-linking layer pattern. The underlying layer is patterned using the cross-linking layer pattern as a mask to form a fine pattern. As a result, two or more patterns may be formed with a given pitch to overcome a limit of a lithography process and to achieve high-integration of the semiconductor device.

The above embodiments of the present invention are illustrative and not limitative. Various alternatives and equivalents are possible. The invention is not limited by the lithography steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for forming a fine pattern of a semiconductor device, the method comprising:
    forming a photoresist pattern over a semiconductor substrate including an underlying layer;
    forming a cross-linking layer on the sidewall of the photoresist pattern;
    removing the photoresist pattern to form a fine pattern comprising the cross-linking layer; and
    patterning the underlying layer using the fine pattern as an etching mask.

2. The method according to claim 1, wherein the underlying layer is selected from the group consisting of: a word line, a bit line, a metal line and the combination thereof.

3. The method according to claim 1, wherein forming the cross-linking layer comprises:
    providing a polymer composition comprising a silicon-including polymer and an organic solvent;
    coating the polymer composition over the photoresist pattern and the underlying layer to form a silicon-including polymer layer;
    performing an exposing process and a baking process on the silicon-including polymer layer to form the cross-linking layer at an interface between the photoresist pattern and the silicon-including polymer layer;
    removing the remaining silicon-including polymer layer which is not involved in the cross-linking layer formation; and blanket-etching the cross-linking layer until an upper portion of the photoresist pattern is exposed.

4. The method according to claim 3, wherein the organic solvent includes a $C_7$-$C_{10}$ alkane solvent and $C_5$-$C_{10}$ alcohol.

5. The method according to claim 4, wherein the alkane solvent is selected from the group consisting of heptane, octane, nonane, decane and a mixture thereof.

6. The method according to claim 4, wherein the alcohol is selected from the group consisting of pentanol, heptanol, octanol, nonanol, decanol and a mixture thereof.

7. The method according to claim 3, wherein the silicon-including polymer comprises silicon in an amount ranging from 10 to 40 wt % based on a total weight of the silicon-including polymer.

8. The method according to claim 3, wherein the silicon-including polymer comprises a cross-linkable functional group.

9. The method according to claim 8, wherein the cross-linkable functional group is an epoxy group.

10. The method according to claim 3, wherein the silicon-including polymer is a polysiloxane compound, a polysilsesquioxane compound or the mixture thereof.

11. The method according to claim 3, wherein the baking process is performed at a temperature capable of making the thickness of the cross-linking layer uniform.

12. The method according to claim 11, wherein the baking process is performed at a temperature ranging from 130 to 200° C.

13. The method according to claim 3, wherein the blanket-etching the cross-linking layer is performed using an etching gas comprising fluorine.

14. The method according to claim 13, wherein the etching gas is selected from the group consisting of: $CF_4$, $CHF_3$, $C_2F_6$, $C_3F_8$, $C_4F_8$, and combinations thereof.

15. The method according to claim 1, wherein the removing the photoresist pattern is performed using a mixture etching gas including oxygen and nitrogen with a flow ratio of $O_2$:$N_2$=1-15%:85-99%.

16. The method according to claim 1, further comprising dipping a wafer in an n-pentanol after removing the photoresist pattern.

17. A method for forming a fine pattern of a semiconductor device, the method comprising:
forming a hard mask film over a semiconductor substrate including an underlying layer;
forming a first photoresist pattern over the hard mask film;
forming a first cross-linking layer on the sidewall of the first photoresist pattern;
removing the first photoresist pattern to form a first fine pattern comprising the first cross-linking layer;
forming the hard mask pattern using the first fine pattern as an etching mask;
forming the second photoresist pattern between the hard mask patterns;
forming a second cross-linking layer on the sidewall of the second photoresist pattern;
removing the second photoresist pattern to form a second fine pattern comprising the second cross-linking layer; and
patterning the underlying layer using the second fine pattern and hard mask pattern as an etching mask.

18. The method according to claim 17, wherein the hard mask film includes an amorphous carbon layer.

19. The method according to claim 17, wherein forming the second cross linking layer comprises:
providing a polymer composition comprising a silicon-including polymer and an organic solvent;
coating the polymer composition over the first photoresist pattern and the hard mask film to form a first silicon-including polymer layer;
performing an exposing process and a baking process on the first silicon-including polymer layer to form a first cross-linking layer at an interface between the first photoresist pattern and the first silicon-including polymer layer;
removing the remaining silicon-including polymer layer which is not involved in the cross-linking layer formation; and
blanket-etching the first cross-linking layer until an upper portion of the first photoresist pattern is exposed.

20. The method according to claim 17, wherein forming the second cross linking layer comprises:
providing a polymer composition comprising a silicon-including polymer and an organic solvent;
coating the polymer composition over the second photoresist pattern to form a second silicon-including polymer layer;
performing an exposing process and a baking process on the second silicon-including polymer layer to form a second cross-linking layer at an interface between the second photoresist pattern and the second silicon-including polymer layer;
removing the remaining silicon-including polymer layer which is not involved in the cross-linking layer formation; and
blanket-etching the second cross-linking layer until an upper portion of the second photoresist pattern is exposed.

* * * * *